United States Patent
Knee et al.

(10) Patent No.: US 11,668,769 B2
(45) Date of Patent: Jun. 6, 2023

(54) SUPERCONDUCTING OUTPUT AMPLIFIER HAVING RETURN TO ZERO TO NON-RETURN TO ZERO CONVERTERS

(71) Applicant: Microsoft Technology Licensing, LLC, Redmond, WA (US)

(72) Inventors: Derek Leslie Knee, Fort Collins, CO (US); Randall M. Burnett, Catonsville, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 118 days.

(21) Appl. No.: 17/224,563

(22) Filed: Apr. 7, 2021

(65) Prior Publication Data
US 2022/0326319 A1  Oct. 13, 2022

(51) Int. Cl.
*G01R 33/58* (2006.01)
*G01R 33/035* (2006.01)
(Continued)

(52) U.S. Cl.
CPC ......... *G01R 33/0358* (2013.01); *G06N 10/00* (2019.01); *G01R 33/0356* (2013.01); *H01L 39/223* (2013.01)

(58) Field of Classification Search
CPC ............... G01R 33/00; G01R 33/0035; G01R 33/0023; G01R 33/0017; G01R 31/3191;
(Continued)

(56) References Cited

U.S. PATENT DOCUMENTS 10,243,582 B1 * 3/2019 Herr .................. H03M 5/02
2001/0025012 A1   9/2001 Tarutani et al.
(Continued)

FOREIGN PATENT DOCUMENTS

WO    8103710 A1   12/1981

OTHER PUBLICATIONS

Sasan Razmkhah et al., A compact high frequency voltage amplifier for superconductor-semiconductor logic interface, arxiv.org, Cornell University library, 201 Olin library Cornel University Ithaca NY 14853, Nov. 6, 2020 (Nov. 6, 2020), XP081808568, herein Razmkhah (Year: 2020).*
(Continued)

*Primary Examiner* — Jermele M Hollington
*Assistant Examiner* — Taqi R Nasir
(74) *Attorney, Agent, or Firm* — Ranjeev Singh; Singh Law, PLLC

(57) ABSTRACT

Superconducting output amplifiers having return to zero to non-return to zero converters are described. An example superconducting output amplifier (OA) includes a first superconducting OA stage having a first DC-SQUID and a second DC-SQUID arranged in parallel to the first DC-SQUID. The superconducting OA includes an input terminal for receiving a single flux quantum (SFQ) pulse train. The superconducting OA includes a first splitter configured to split a first set of SFQ pulses corresponding to the SFQ pulse train into a first return to zero (RZ) signal and a second RZ signal. The superconducting OA includes a first return to zero to non-return to zero (RZ-NRZ) converter configured to convert the first RZ signal into a first non-return to zero (NRZ) signal for driving the first DC-SQUID, and a second RZ-NRZ converter configured to convert the second RZ signal into a second NRZ signal for driving the second DC-SQUID.

20 Claims, 6 Drawing Sheets

(51) Int. Cl.
*G06N 10/00* (2022.01)
*H01L 39/22* (2006.01)

(58) Field of Classification Search
CPC ............ G01R 33/0358; G01R 33/0356; G01R 33/0354; G01R 33/0082; G01R 33/0094; G01R 33/0352; G01B 7/004; G01C 17/38; G06F 3/017; G06F 3/0346; G06F 3/012; G06F 9/3877; H01L 39/223; G06N 10/00
See application file for complete search history.

(56) References Cited

U.S. PATENT DOCUMENTS

2019/0149139 A1* 5/2019 Braun ................ H03K 3/38
 327/225
2019/0363688 A1* 11/2019 Egan ................. H03K 19/195

OTHER PUBLICATIONS

"International Search Report and Written Opinion Issued in PCT Application No. PCT/US22/017727", dated Jun. 21, 2022, 16 Pages.
Razmkhah, et al., "A Compact High Frequency Voltage Amplifier for Superconductor-Semiconductor Logic Interface", in Repository of arXiv:2011.03625v1, Nov. 6, 2020, 5 Pages.

* cited by examiner

SUPERCONDUCTING OUTPUT AMPLIFIER HAVING RETURN TO ZERO TO NON-RETURN TO ZERO CONVERTERS

BACKGROUND

Semiconductor based integrated circuits used in electronic devices include digital circuits based on complimentary metal-oxide semiconductor (CMOS) technology. CMOS technology, however, is reaching its limits in terms of the device size. In addition, leakage current in CMOS based digital circuits is causing high power consumption even when these circuits are not being accessed.

As an example, servers in a data center are increasingly consuming large amounts of power. The consumption of power is partly the result of power loss from the dissipation of energy even when the CMOS circuits are inactive. This is because even when such circuits, such as random-access memories, are inactive and are not consuming any dynamic power, they still consume power because of the need to maintain the state of CMOS transistors. In addition, there is a certain amount of current leakage even when the CMOS circuits are inactive. Thus, even when such circuits are not processing operations, such as read/write, power is wasted not only as a result of the requirement to maintain the state of the CMOS transistors, but also as a result of the current leakage.

An alternative approach to CMOS technology-based systems is the use of superconducting logic-based systems. Such superconducting logic-based systems may also be used in combination with CMOS technology based components. Superconducting logic-based systems may include output amplifiers, which need to be improved for the various drawbacks such output amplifiers may have.

SUMMARY

In one example, the present disclosure relates to a superconducting output amplifier including a first superconducting output amplifier (OA) stage having a first direct current-superconducting quantum interference device (DC-SQUID) and a second DC-SQUID arranged in parallel to the first DC-SQUID. The superconducting output amplifier may further include an input terminal for receiving a single flux quantum (SFQ) pulse train. The superconducting output amplifier may further include a first splitter configured to split a first set of SFQ pulses corresponding to the SFQ pulse train into a first return to zero (RZ) signal and a second RZ signal. The superconducting output amplifier may further include a first return to zero to non-return to zero (RZ-NRZ) converter configured to convert the first RZ signal into a first non-return to zero (NRZ) signal for driving the first DC-SQUID, and a second RZ-NRZ converter configured to convert the second RZ signal into a second NRZ signal for driving the second DC-SQUID.

In another aspect, the present disclosure relates to a method for a superconducting output amplifier comprising a plurality of superconducting output amplifier (OA) stages. The method may include receiving a pulse train comprising a plurality of single flux quantum (SFQ) pulses. The method may further include processing the pulse train to generate a first set of return to zero (RZ) signals and a second set of RZ signals. The method may further include using a first set of return to zero to non-return to zero (RZ-NRZ) converters, converting the first set of RZ signals into a first set of non-return to zero (NRZ) signals for driving a first set of direct current-superconducting quantum interference devices (DC-SQUIDs) associated with the plurality of superconducting OA stages. The method may further include using a second set of RZ-NRZ converters, converting the second set of RZ signals into a second set of NRZ signals for driving a second set of DC-SQUIDS associated with the plurality of superconducting OA stages. The method may further include using the stack of the plurality of superconducting OA stages, converting the first set of NRZ signals and the second set of NRZ signals into an output voltage waveform.

In yet another aspect, the present disclosure relates to a superconducting output amplifier including a first superconducting output amplifier (OA) stage having a first direct current-superconducting quantum interference device (DC-SQUID) and a second DC-SQUID arranged in parallel to the first DC-SQUID. The superconducting output amplifier may further include an input terminal for receiving a single flux quantum (SFQ) pulse train comprising a plurality of SFQ pulses, where the SFQ pulse train comprises data corresponding to reciprocal quantum logic return to zero encoding or data corresponding to phase-mode logic encoding. The superconducting output amplifier may further include a first splitter configured to split a first set of SFQ pulses corresponding to the SFQ pulse train into a first return to zero (RZ) signal and a second RZ signal. The superconducting output amplifier may further include a first return to zero to non-return to zero (RZ-NRZ) converter configured to convert the first RZ signal into a first non-return to zero (NRZ) signal for driving the first DC-SQUID, and a second RZ-NRZ converter configured to convert the second RZ signal into a second NRZ signal for driving the second DC-SQUID.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
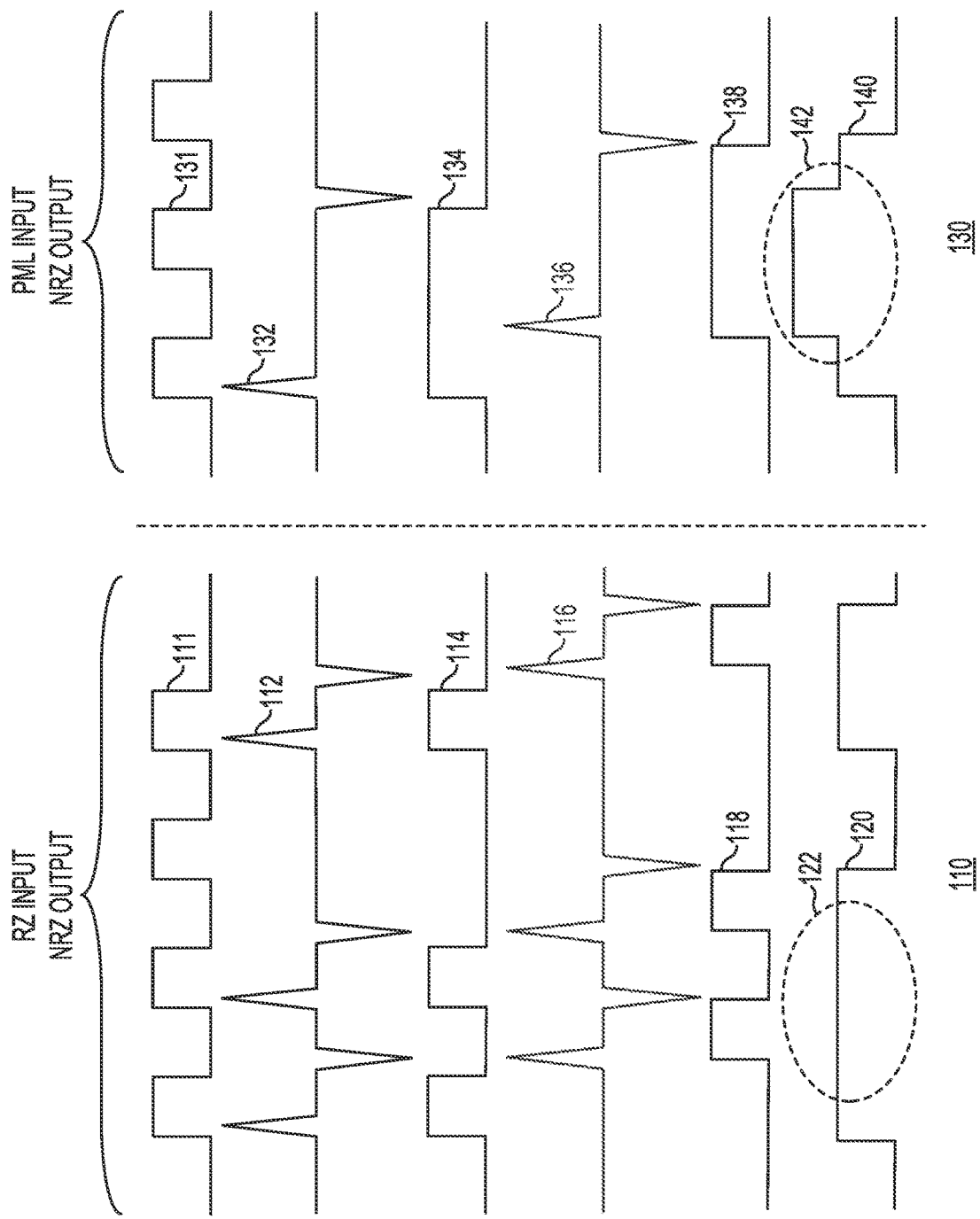
FIG. 1 shows graphs illustrating an uneven output voltage waveform generated by a compound direct current-superconducting quantum interference device (DC-SQUID) in accordance with one example.

Examples described in this disclosure relate to a superconducting output amplifier having return to zero to non-return to zero converters. Certain examples relate to superconducting output amplifiers having stacked compound direct current-superconducting quantum interference devices (DC-SQUIDs). A superconducting output amplifier with compound DC-SQUIDs may be implemented using any single flux quantum (SFQ) compatible logic. One example of such logic is quantum flux parametron (QFP). Another example of such logic is the reciprocal quantum logic (RQL). Certain examples further relate to reciprocal quantum logic (RQL) and phase-mode logic (PML) compatible superconducting output amplifiers. Unlike CMOS transistors, the RQL circuits are superconductor circuits that use Josephson junction-based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have zero resistance. As an example, at temperatures below Tc (e.g., 9.3 K), niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type junctions, the superconducting electrons are described by a quantum mechanical wave-function. A changing phase difference in time of the phase of the superconducting electron wave-function between the two superconductors corresponds to a potential difference between the two superconductors. In RQL circuits, in one example, the SIS type junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the ROL circuits may be powered using alternating current (AC) power. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock, A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B (AanB) gate, and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B, goes to output Q1 and the second input pulse goes to output Q2. The logical behavior of these gates may be based on the reciprocal data encoding mentioned earlier. As an example, a positive pulse changes the internal flux state of the inductive loop, but the trailing negative pulse erases the internal state every clock cycle, which in turn produces combinational logic behavior.

For RQL, using RZ data encoding, a logical "1" may be encoded as a positive SFQ pulse followed by a negative SFQ pulse occurring half a period later, and a logical "0" may be encoded as no pulses. Alternately, for RQL operating in "phase-mode," the negative SFQ pulse may be delayed for an arbitrary number of clock cycles, but it may still be separated from the positive pulse by an odd number of half-clock cycles. In phase-mode logic (PML), digital values may be encoded as Josephson junction (JJ) phase. A high phase may indicate a logic "1" and a low phase may indicate a logic "0." Unlike return to zero encoding of reciprocal quantum logic (RQL) logic, these values are persistent across dock cycles because there is no requirement for a reciprocal pulse to reset the JJ phase. As an example, if an AC clock with four phases was used to power the phase-mode logic circuit, the output of the phase-mode logic circuit may be persistent across all four phases of the AC dock.

In superconducting logic-based systems, the output amplifier converts a positive going single-flux quantum (SFQ) input pulse into DC voltage. The subsequent negative going SFQ disables this output voltage. Since there are no controllable resistors available in superconducting logic-based systems, the DC voltage is created by filtering the output oscillations of the direct current-superconducting quantum interference device (DC-SQUIDs). A DC-SQUID may consist of two Josephson junctions (JJs), connected in a loop via two inductors. An external DC current source may bias the DC-SQUID at a particular DC operating point such that oscillations will occur when the additional magnetic flux is coupled, via an inductive coupling, into the loop formed with the JJs. As one of the JJs fires, it causes the other JJ in the loop to fire, which starts a positive feedback sequence resulting in the DC-SQUID loop oscillating. Each oscillation of the DC-SQUID may release an SFQ voltage pulse which may then be averaged, via low-pass filters (LPFs) to create a smoothed DC voltage. The DC-SQUIDs may be stacked to create a larger total output voltage, which is output by the output amplifier.

FIG. 1 shows graphs 110 and 130 illustrating an uneven output voltage waveform generated by a compound direct current-superconducting quantum interference device (DC-SQUID). The data to be processed by the compound DC-SQUID is received in the form of a pulse train having both positive and negative SFQ pulses. Thus, the data input is inherently a return to zero (RZ) signal and is converted by the output amplifier into non-return to zero (NRZ) signal.

This conversion is typically achieved by driving the two inputs of the compound DC-SQUID using different JTL, vine trees that are driven with signals that are 180 degrees out of phase. As shown in graph 110 of FIG. 1, input pulse train 112 (an RZ signal) may be received via one of the DC-SQUIDS associated with the compound DC-SQUID and input pulse train 116 (an RZ signal) may be received by the other DC-SQUID. Reference clock 111 is shown to illustrate the relative timing of the various waveforms shown in FIG. 1, The actual clock signal, however, is a sinusoidal waveform not shown in FIG. 1. Pulse train 116 is 180 degrees out of phase relative to pulse train 112. Waveform 114 represents the JJ phase of data corresponding to pulse train 112 and waveform 118 represents the JJ phase of data corresponding to pulse train 116. In this example, the JJ phase represents an integral of the voltage associated with the SFQ pulses in respective pulse trains 112 and 116. Waveform 120 represents the non-return to zero (NRZ) output voltage waveform of the compound DC-SQUID. Dotted ellipse 122 identifies the center portion of waveform 120 where glitches can occur.

With continued reference to FIG. 1, graph 130 shows the waveforms associated with a compound DC-SQUID when the input data is phase-mode logic encoded data and the output is in the non-return to zero (NRZ) signal form. As shown in graph 130 of FIG. 1, input pulse train 132 (phase-mode logic (PML) input) may be received via one of the DC-SQUIDS associated with the compound DC-SQUID and input pulse train 136 (another PML input) may be received by the other DC-SQUID. Reference clock 131 is shown to illustrate the relative timing of the various waveforms shown in FIG. 1. The actual clock signal, however, is a sinusoidal waveform not shown in FIG. 1. Waveform 134 represents the JJ phase of data corresponding to pulse train 132 and waveform 138 represents the JJ phase of data corresponding to pulse train 136. In this example, the JJ phase represents an integral of the voltage associated with the SFQ pulses in respective pulse trains 132 and 136. Waveform 140 represents the phase-mode logic output voltage waveform of the compound DC-SQUID. The two DC-SQUIDS in the compound DC-SQUID can load down each other when not driven. As shown via the dotted ellipse 142, this can cause the output voltage waveform for the phase-mode logic input to have two different output voltage levels. Other glitches in the output voltage can also occur because of the different phases of the two input signals.

Figure 2:
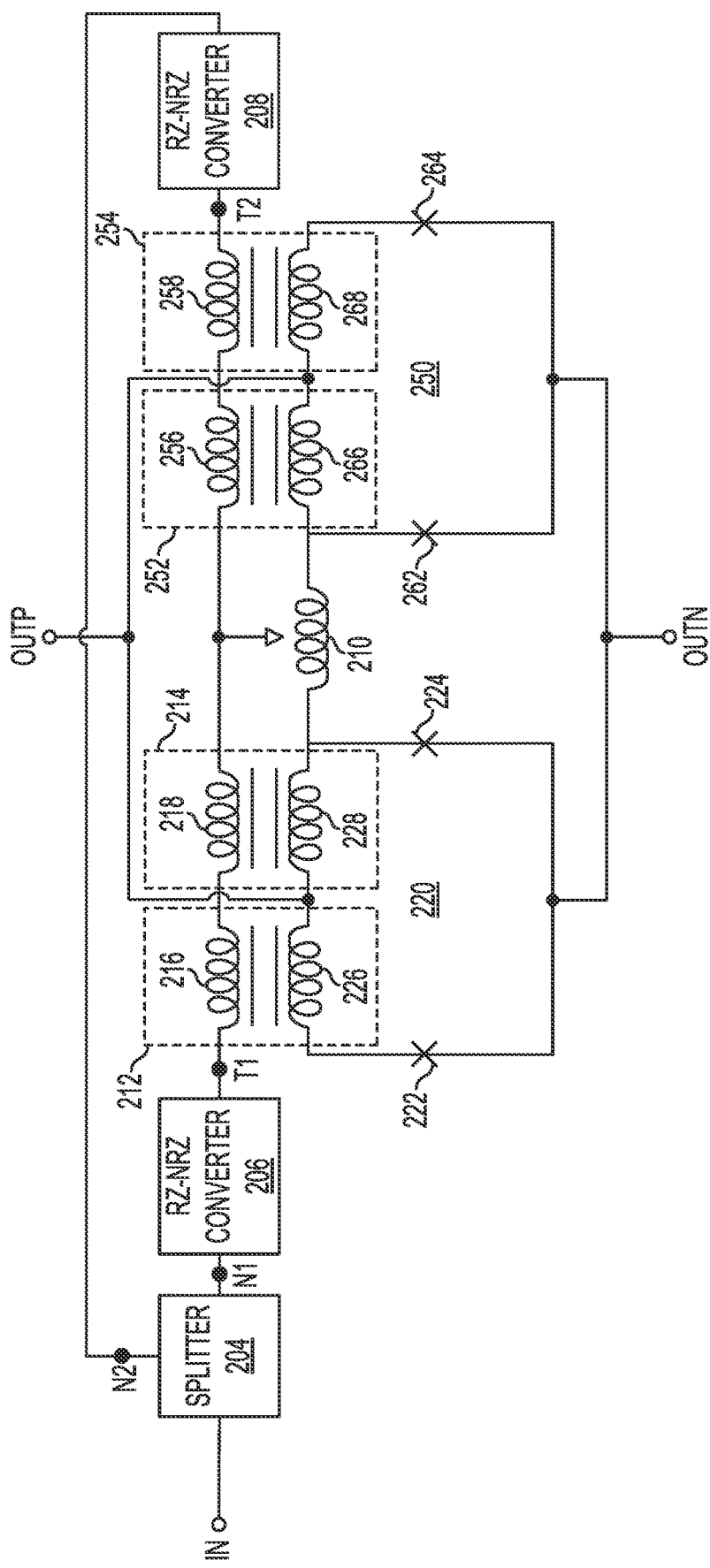
FIG. 2 shows a circuit diagram of an example superconducting output amplifier (OA) stage with return to zero (RZ) to non-return to zero (NRZ) converters in accordance with one example.

FIG. 2 shows a circuit diagram of an example superconducting output amplifier (OA) stage 200 with return to zero (RZ) to non-return to zero (NRZ) converters accordance with one example. As used herein the term "return to zero" signals includes, but is not limited to, pulse signals in which the signal returns to zero between each pulse (or between some other set number of pulses) regardless of the number of consecutive high or low values (e.g., "1s" or "0s"). As used herein the term "non-return to zero" signals includes, but is not limited to, signals that return to zero only when there is a transition from a high value (e.g., 1) to a low value (e.g., "0"), Superconducting OA stage 200 is configured to address the variations in the output voltage level described earlier with respect to FIG. 1. Superconducting OA stage 200 may include a compound DC-SQUID, which may include DC-SQUID 220 and DC-SQUID 250. Superconducting OA stage 200 may further include a splitter 204 coupled to an input terminal (IN) for receiving a single flux quantum (SFQ) pulse train. Splitter 204 may split the SFQ pulse train received via the input terminal (IN) into two return to zero (RZ) signals. Superconducting OA stage 200 may further include a return to zero to non-return to zero (RZ-NRZ) converter 206 between the node N1 and a terminal T1, which is associated with DC-SQUID 220. In addition, superconducting OA stage 200 may further include an RZ-NRZ converter 208 between the node N2 and a terminal T2, which is associated with DC-SQUID 250. Each RZ-NRZ converter may include circuitry to convert the return to zero signals into non-return to zero signals. In this example, each RZ-NRZ converter may further increase circuitry to amplify a magnitude of the current associated with the RZ signals or the NRZ signals. As an example, DC-bias may be used to increase the magnitude of the current associated with the RZ signals or the NRZ signals. In one example, each RZ-NRZ converter may be based on a state-based design including a set-reset flip-flop. The set-reset logic and the associated state-based design may prevent race conditions. Thus, even if the delay between the set and reset signals is inconsistent, the RZ-NRZ converter may still produce consistent output signals. Moreover, in this example, the state-based design dependent on signal edge transitions also ensures that there are no glitches in the NRZ signal because of timing misalignments or clock-rate misalignments.

Figure 3:
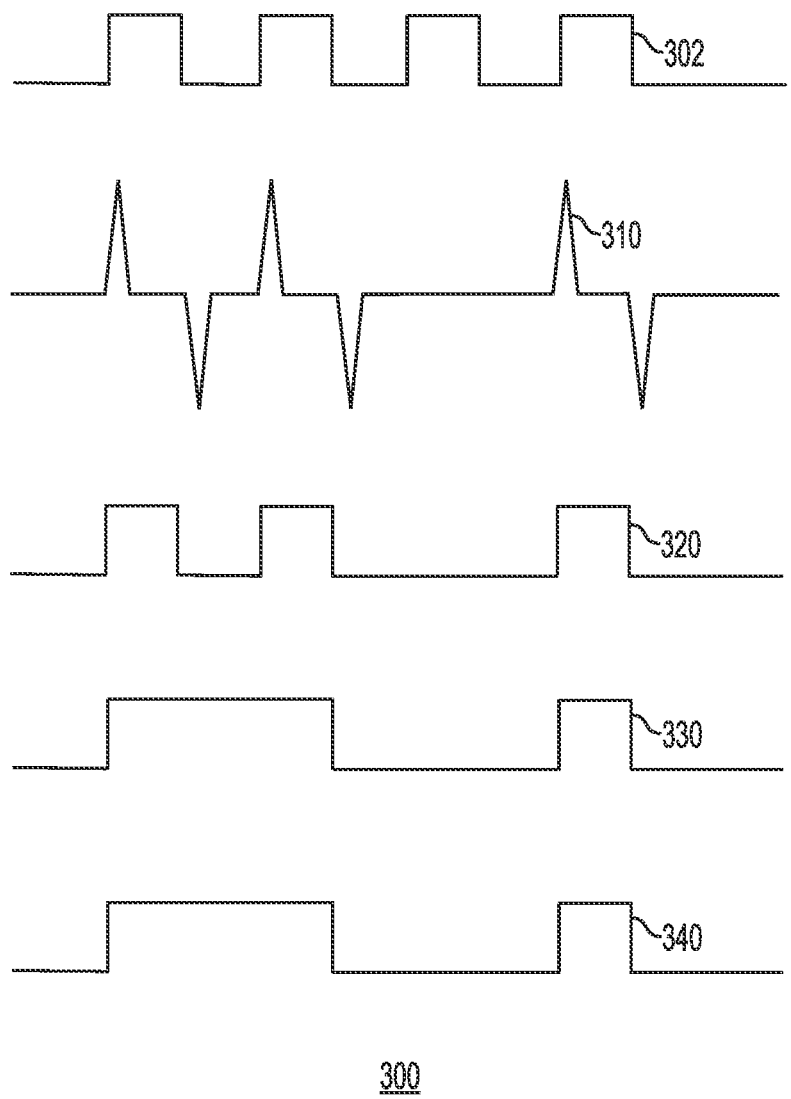
FIG. 3 is a graph showing the waveforms associated with the superconducting output amplifier OA stage of FIG. 2 in accordance with one example.

FIG. 3 is a graph showing waveforms 300 associated with superconducting output amplifier OA stage 200 of FIG. 2. Thus, as shown in FIG. 3, waveform 310 corresponds to a pulse train that may be received via the input terminal (IN). Reference clock 302 is shown to illustrate the relative timing of the various waveforms shown in FIG. 3. The actual clock signal, however, is a sinusoidal waveform not shown in FIG. 3. As shown in waveform 310, the pulse train may include both positive SFQ pulses and negative SFQ pulses. As described above, splitter 204 may split this pulse train into two pulse trains comprising return to zero signals. FIG. 3 shows example waveforms 320 and 330 corresponding to the return to zero signals. Waveform 340 of FIG. 3 shows an example form of the non-return-to zero signals that are output by each of RZ-NRZ converter 206 and 208.

Still referring to FIG. 2, in one example, a resonator clock source may generate a sinusoidal or an alternating current (AC) clock that may provide both clock and power to the components associated with superconducting OA stage 200. DC-SQUID 220 and a DC-SQUID 250 may be coupled via an inductor 210 forming a compound DC-SQUID. The NRZ signals output by RZ-NRZ, converter 206 may be coupled to DC-SQUID 220 via transformers 212 and 214. The NRZ signals output by RZ-NRZ converter 208 may be coupled to DC-SQUID 250 via transformers 252 and 254. Superconducting OA stage 200 may provide a positive output voltage at the OUTP terminal and a negative output voltage at the OUTN terminal in response to the NRZ signals.

With continued reference to FIG. 2, DC-SQUID 220 may include two Josephson junctions (JJs) 222 and 224, which may be coupled in a loop via inductors 226 and 228. DC-SQUID 250 may include two JJs 262 and 264, which may be coupled in a loop via inductors 266 and 268. An external DC current source (not shown), located between the OUTP terminal and the OUTN terminal, may bias each of DC-SQUID 220 and DC-SQUID 250 at a particular operating point such that the DC-SQUIDs may oscillate when additional magnetic flux is applied to the respective loops. The inductive coupling between inductors 216 and 226 and the inductive coupling between inductors 218 and 228 may provide additional magnetic flux to DC-SQUID 220. Similarly, the inductive coupling between inductors 256 and 266 and the inductive coupling between inductors 258 and 268 may provide additional magnetic flux to DC-SQUID 250.

The additional magnetic flux will result in the firing of the DC-SQUID that is receiving the additional magnetic flux. As one of the JJs (JJ 222 or JJ 224) fires, it causes the other JJ (JJ 222 or JJ 224) in the loop (e.g., the loop corresponding to DC-SQUID 220) to fire, which starts a positive feedback sequence resulting in the DC-SQUID loop oscillating. Similarly, as one of the JJs (JJ 262 or JJ 264) fires, it causes the other JJ (JJ 262 or JJ 264) in the loop (e.g., the loop corresponding to DC-SQUID 250) to fire, which starts a positive feedback sequence resulting in the DC-SQUID loop oscillating. Each oscillation of the DC-SQUIDS associated with the firing of the DC-SQUID may release a voltage pulse. Repeated voltage pulses can be filtered to produce the DC output voltage. Although FIG. 2 shows a certain number of components of superconducting OA stage 200 arranged in a certain manner, there could be more or fewer number of components arranged differently.

In terms of the operation of superconducting OA stage 200, in this example, transformers for both DC-SQUIDS 220 and 250 are driven by the input currents generated by the NRZ signals, which are based on the same SFQ pulse train received via the input terminal (IN). As a result, advantageously both sides of the compound DC-SQUID, including DC-SQUID 220 and DC-SQUID 250, are active at the same time when generating the output voltage. This, in turn, results in a smoother output voltage waveform.

Figure 4:
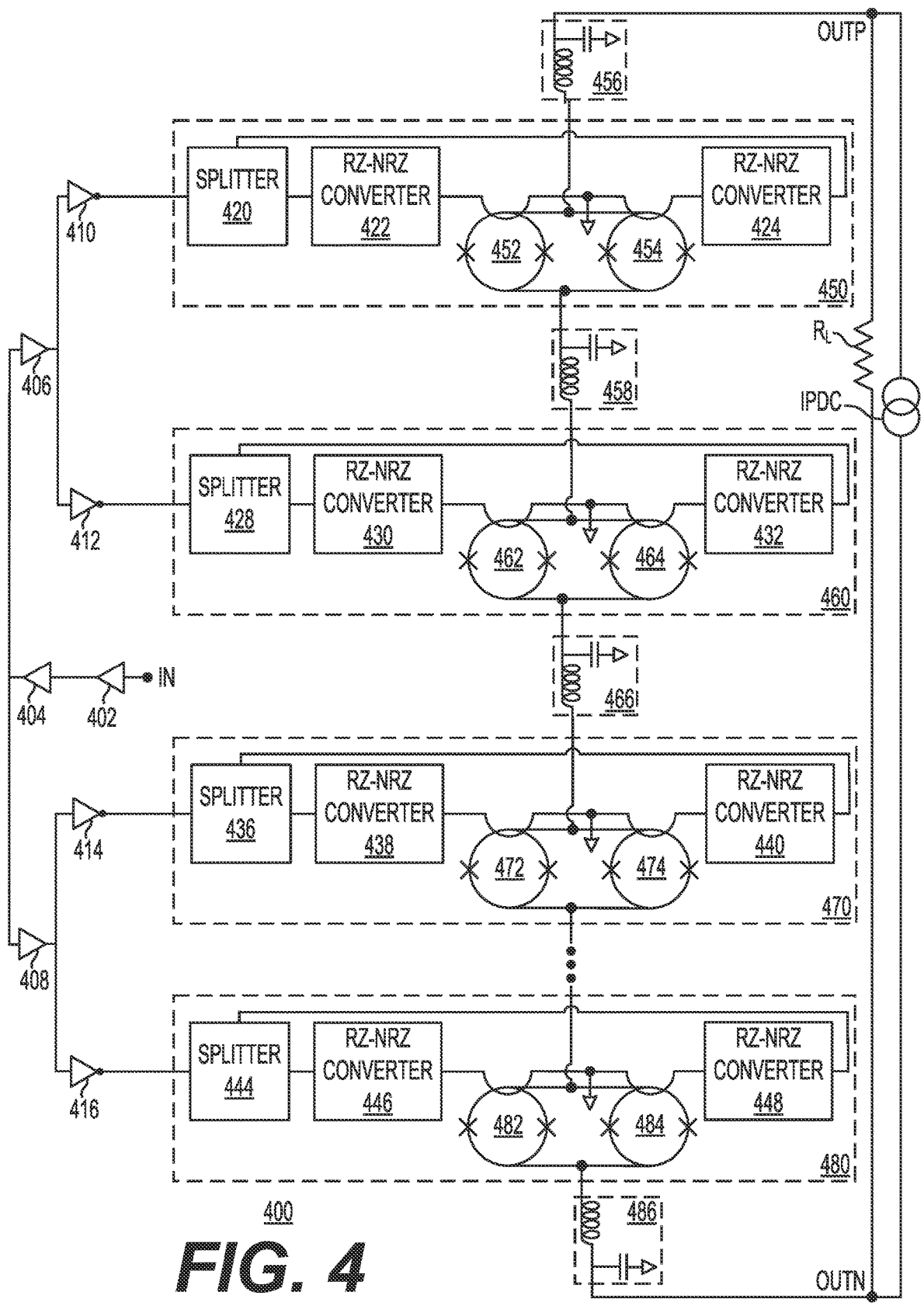
FIG. 4 shows a superconducting output amplifier having return to zero (RZ) to non-return to zero converters (NRZ) in accordance with one example.

FIG. 4 shows a superconducting output amplifier having return to zero (RZ) to non-return to zero converters (NRZ) in accordance with one example. Superconducting output amplifier 400 may include a stack of superconducting OA stages 450, 460, 470, and 480 connected in series. In this example, superconducting OA stage 200 may be used to implement each of superconducting OA stages 450, 460, 470, and 480. Superconducting output amplifier 400 may provide a positive output voltage via the positive output voltage terminal (OUTP) and a negative output voltage via the negative voltage terminal (OUTN). The load associated with superconducting output amplifier 400 is represented as a resistive load ($R_L$). In addition, as shown in FIG. 4, a DC current source may be configured to provide a DC bias current (IPDC) to each of the compound DC-SQUIDS associated with superconducting OA stages 450, 460, 470, and 480. An LC filter 456 may be coupled between the compound DC-SQUID associated with superconducting OA stage 450 and the positive output voltage terminal (OUTP). An LC filter 458 may be coupled between the compound DC-SQUID associated with superconducting OA stage 450 and the compound DC-SQUID associated with superconducting OA stage 460. Another interstage filter 466 may be coupled between the compound DC-SQUID associated with superconducting OA stage 460 and the compound DC-SQUID associated with superconducting OA stage 470. An LC filter 486 may be coupled between the compound DC-SQUID associated with superconducting OA stage 480 and the negative output voltage terminal (OUTN). The LC filters may be configured to smooth the output voltages generated by the oscillating DC-SQUIDS.

Wth continued reference to FIG. 4, an input single flux quantum (SFQ) pulse train having a 0 degree phase may be coupled, via an input terminal (IN), to a driver associated with each of the compound DC-SQUIDS in the manner shown in FIG. 4. The SFQ pulse train may encode the digital data that needs to be amplified using the output amplifier. In one example, the digital data may be encoded based on using a pair of positive and negative (reciprocal) SFQ pulses. As an example, as part of reciprocal quantum logic encoding, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock. Alternately, for RQL operating in "phase-mode", the negative SFQ pulse may be delayed for an arbitrary number of clock cycles, but it may still be separated from the positive pulse by an odd number of half-clock cycles. In phase-mode logic (PML), digital values may be encoded as Josephson junction (JJ) phase. A high phase may indicate a logic "1" and a low phase may indicate a logic "0."

Still referring to FIG. 4, the SFQ pulse train may be coupled to the compound DC-SQUIDS via a vine tree distribution network. The vine tree distribution network may include several Josephson transmission lines (JTLs) arranged in the form of a vine tree. Thus, in this example, the SFQ pulse train may be coupled to splitter 420 via a Josephson transmission line (JTL) 402, a JTL 404, a JTL 406, and a JTL 410. Splitter 420 may split this pulse train into two pulse trains comprising return to zero signals. The RZ signals may be coupled to an RZ-NRZ converter (e.g., RZ-NRZ converter 422 or RZ-NRZ converter 424) arranged on each side of the compound DC-SQUID associated with superconducting OA stage 450. Each RZ-NRZ converter may include circuitry to convert the return to zero signals into non-return to zero signals. In addition, each RZ-NRZ converter may scale up the magnitude of the current associated with the RZ signals received via the splitter. In one example, each RZ-NRZ converter may be based on a state-based design including a set-reset flip-flop. As an example, DC-bias may be used to increase the magnitude of the current associated with the RZ signals. The SFQ pulse train may be coupled to splitter 428 via a JTL 402, a JTL 404, a JTL 406, and a JTL 412. Splitter 428 may split this pulse train into two pulse trains comprising returnto zero signals. The RZ signals may be coupled to an RZ-NRZ converter (e.g., RZ-NRZ converter 430 or RZ-NRZ converter 432) arranged on each side of the compound DC-SQUID associated with superconducting OA stage 460. Each RZ-NRZ converter may include circuitry to convert the return to zero signals into non-return to zero signals. In addition, each RZ-NRZ converter may scale up the magnitude of the current associated with the RZ signals received via the splitter. As an example, DC-bias may be used to increase the magnitude of the current associated with the RZ signals. In one example, each RZ-NRZ converter may be based on a state-based design including a set-reset flip-flop.

With continued reference to FIG. 4, the SFQ pulse train may be coupled to splitter 436 via a JTL 402, a JTL 404, a JTL 408, and a JTL 414. Splitter 436 may split this pulse train into two pulse trains comprising return to zero signals. The RZ signals may be coupled to an RZ-NRZ converter (e.g., RZ-NRZ converter 438 or RZ-NRZ converter 440) arranged on each side of the compound DC-SQUID associated with superconducting OA stage 470. Each RZ-NRZ converter may include circuitry to convert the return to zero signals into non-return to zero signals. In addition, each RZ-NRZ converter may scale up the magnitude of the current associated with the RZ signals received via the splitter. As an example, DC-bias may be used to increase the magnitude of the current associated with the RZ signals. In one example, each RZ-NRZ converter may be based on a state-based design including a set-reset flip-flop. The SFQ pulse train may be coupled to splitter 444 via a JTL 402, a JTL 404, a JTL 408, and a JTL 416. Splitter 444 may split this pulse train into two pulse trains comprising return to zero signals. The RZ signals may be coupled to an RZ-NRZ converter (e.g., RZ-NRZ converter 446 or RZ-NRZ converter 448) arranged on each side of the compound DC-SQUID associated with superconducting OA stage 480. Each RZ-NRZ converter may include circuitry to convert the return to zero signals into non-returnto zero signals. In addition, each RZ-NRZ converter may scale up the magnitude of the current associated with the RZ signals received via the splitter. As an example, DC-bias may be used to increase the magnitude of the current associated with the RZ signals. In one example, each RZ-NRZ converter may be based on a state-based design including a set-reset flip-flop. Advantageously, the increase in the current amplitude of the RZ signals from the RZ-NRZ converters may result in a reduction of the number of stacked compound DC-SQUIDs required for the superconducting output amplifier.

Each compound DC-SQUID may generate a voltage output based on the oscillations associated with the DC-SQUIDs. The IPDC current is set to a value that is sufficient to pre-bias the DC-SQUIDs but is not enough to trigger the Josephson junctions included as part of the DC-SQUIDs. Additional current is coupled to the DC-SQUIDs through the SFQ pulses received via the input terminal. The DC-SQUID fires when the current flowing through it exceeds the critical current of the JJs included as part of the DC-SQUID. The periodic firing of the DC-SQUIDs results in oscillations that are smoothed using the LC filters to generate the output voltage waveform. Advantageously, because flux can be coupled to both sides of the compound DC-SQUIDs using the same driver, there is no need for separate JTL vine trees. This, in turn, reduces the overall area of the superconducting output amplifier formed in an integrated circuit. Moreover, because the separate RZ-NRZ converters couple flux to the DC-SQUIDs, there is no adverse loading of one DC-SQUID by the other DC-SQUID. As a result, the output voltage waveform produced by superconducting output amplifier 400 is more uniform. In addition, the return to zero signal to non-return to zero conversion is not performed using the compound DC-SQUIDs. Moreover, advantageously as part of the architecture of the example superconducting output amplifier 400, the integration of the RZ-NRZ converters with the respective driver occurs at a single point within each row, which makes the integration simpler.

Although FIG. 4 shows a certain number of components of superconducting output amplifier 400 arranged in a certain manner, there may be additional or fewer components arranged differently. As an example, the input SFQ pulses may be distributed via a tree-like distribution network, a vine-like distribution network, or a hybrid distribution network including some combination of both the tree-like distribution network and the vine-like distribution network. Such networks may be formed using multiple JThs. In addition, although FIG. 4 shows two separate RZ-NRZ converters for each row, a single RZ-NRZ converter may be used per row. Alternatively, a single RZ-NRZ converter may be used for a set of four rows. Moreover, although FIG. 4 describes the RZ-NRZ converters as scaling up the magnitude of the current associated with the RZ signals, these converters may alternatively, or additionally, scale up the magnitude of the current associated with the NRZ signals. In addition, although FIG. 4 shows the drivers and the RZ-NRZ converters as separate blocks, their functionality may be combined into a single block. Indeed, the distribution and the arrangement of the driver, the splitter, and the RZ-NRZ converter in relation to the compound DC-SQUIDs is only one of the many ways these components may be arranged to realize some or all of the advantages noted earlier.

Figure 5:
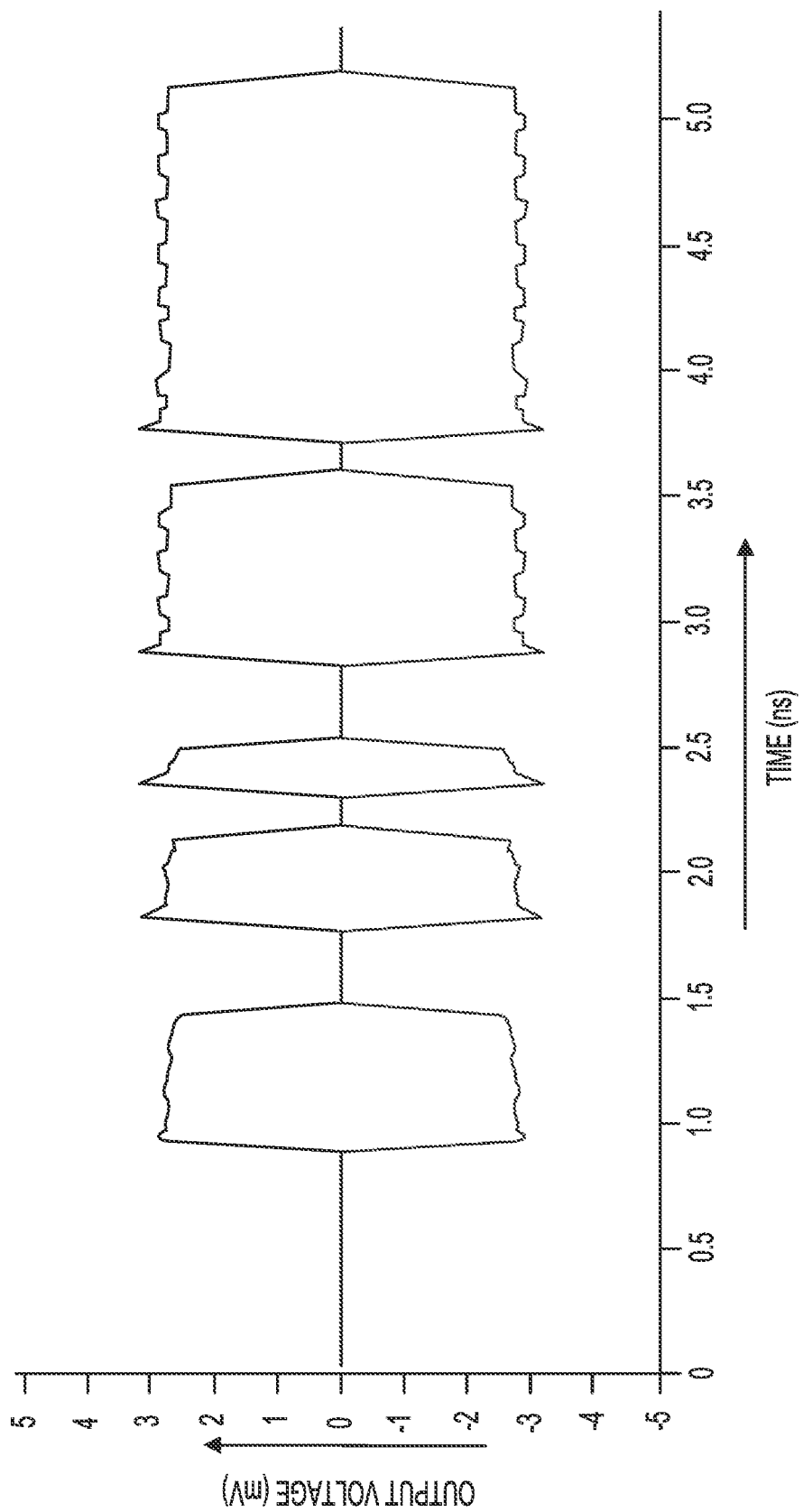
FIG. 5 shows an output waveform corresponding to the superconducting output amplifier of FIG. 4 in accordance with one example.

FIG. 5 shows an output waveform 500 corresponding to superconducting output amplifier 400 of FIG. 4 in accordance with one example. Output waveform 500 represents a simulated output voltage between the positive output voltage terminal (OUTP) the negative output voltage terminal (OUTN) of superconducting output amplifier 400 of FIG. 4. As shown in FIG. 5, simulations of the output waveform show a fully differential output voltages with only two different amplitude levels (e.g., 0 mV and 6 mV), Advantageously, the kind of output voltage waveform distortion shown in FIG. 1 has been eliminated.

Figure 6:
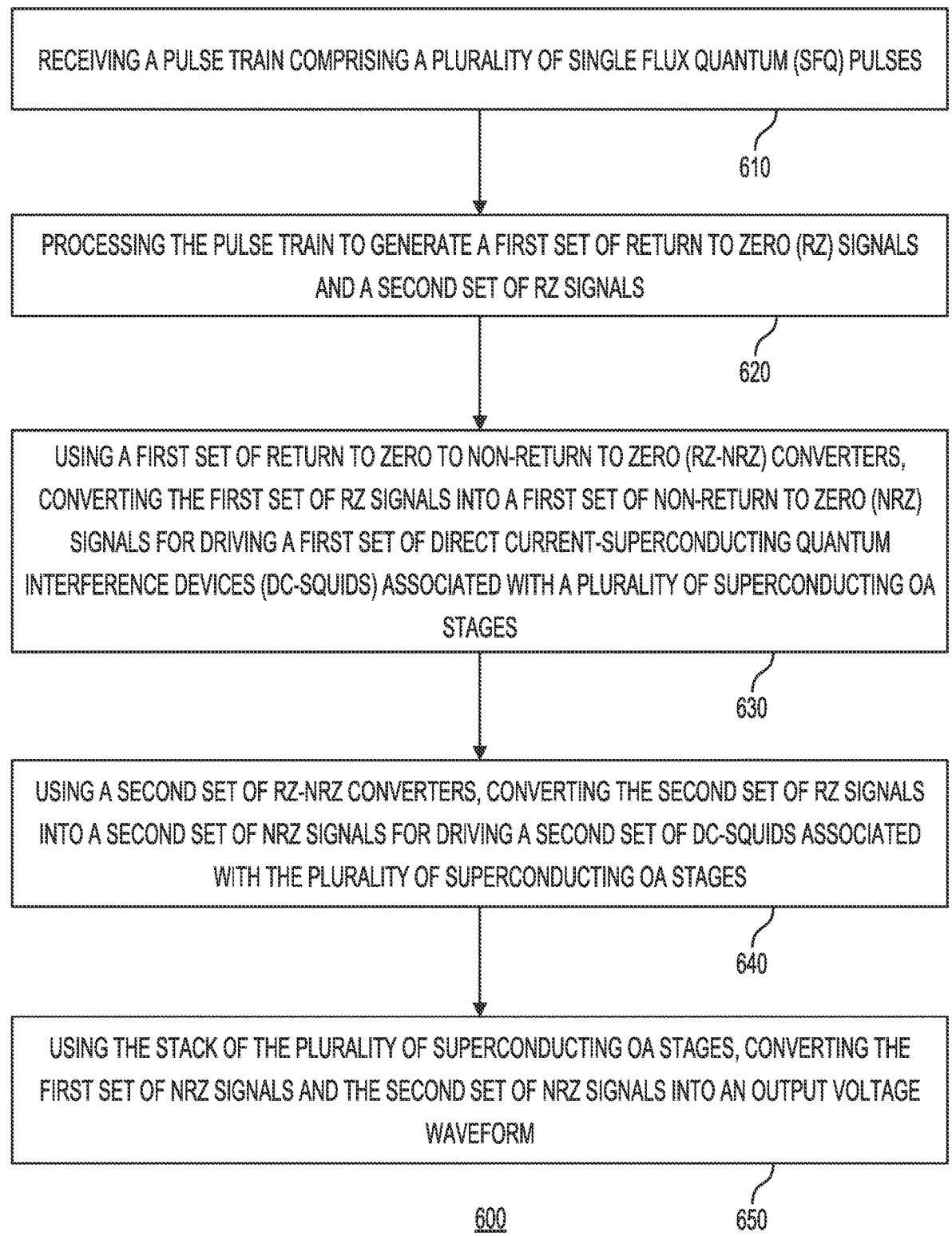
FIG. 6 shows a flow chart for a method related to a superconducting output amplifier in accordance with one example.

FIG. 6 shows a flow chart 600 for a method related to a superconducting output amplifier 400 of FIG. 4 in accordance with one example. In this example, the method may be performed by the superconducting output amplifier described with respect to FIG. 4. Step 610 may include superconducting output amplifier 400 receiving a pulse train comprising a plurality of single flux quantum (SFQ) pulses. In this example, the pulse train including the SFQ pulses may be received via the input terminal (IN) and the data may be encoded using reciprocal quantum logic encoding or phase-mode logic encoding.

Step 620 may include processing the pulse train to generate a first set of return to zero (RZ) signals and a second set of RZ signals. This step may include using a splitter to split the pulse train to generate RZ signals. The set of splitters may include splitters 420, 428, 436, and 444 described earlier with respect to FIG. 4.

Step 630 may include using a first set of return to zero to non-return to zero (RZ-NRZ) converters, converting the first set of RZ signals into a first set of non-return to zero (NRZ) signals for driving a first set of direct current-superconducting quantum interference devices (DC-SQUIDS) associated with the plurality of superconducting OA stages. In one example, converting the RZ signals into the NRZ signals may include increasing the current amplitude of the RZ signals. This process may include DC-biasing the RZ signals. The first set of DC-SQUIDs may include DC-SQUIDs 452, 462, 472, and 482. The RZ-NRZ converters 422, 430, 438, and 446 may be associated with DC-SQUIDs 452, 462, 472, and 482.

Step 640 may include using a second set of RZ-NRZ converters, converting the second set of RZ signals into a second set of NRZ signals for driving a second set of DC-SQUIDs associated with the plurality of superconducting OA stages. In one example, converting the RZ signals into the NRZ signals may include increasing the current amplitude of the RZ signals. This process may include DC-biasing the RZ signals. The second set of DC-SQUIDs may include DC-SQUIDs 454, 464, 474, and 484. The RZ-NRZ converters 424, 432, 440, and 448 may be associated with DC-SQUIDs 454, 464, 474, and 484.

Step 650 may include using the stack of the plurality of superconducting OA stages, converting the first set of NRZ signals and the second set of NRZ signals into an output voltage waveform. The generation of the output voltage waveform using the superconducting OA states is explained earlier with respect to FIGS. 2-4. As part of this step, the output voltages generated by each of the compound DC-SQUIDS associated with the superconducting OA stages may be filtered using the LC filters may then be summed up to generate the output voltage waveform such as the one shown in FIG. 5.

In conclusion, in one example, the present disclosure relates to a superconducting output amplifier including a first superconducting output amplifier (OA) stage having a first direct current-superconducting quantum interference device (DC-SQUID) and a second DC-SQUID arranged in parallel to the first DC-SQUID. The superconducting output amplifier may further include an input terminal for receiving a single flux quantum (SFQ) pulse train. The superconducting output amplifier may further include a first splitter configured to split a first set of SFQ pulses corresponding to the SFQ pulse train into a first return to zero (RZ) signal and a second RZ signal. The superconducting output amplifier may further include a first return to zero to non-return to zero (RZ-NRZ) converter configured to convert the first RZ signal into a first non-return to zero (NRZ) signal for driving the first DC-SQUID, and a second RZ-NRZ converter configured to convert the second RZ signal into a second NRZ signal for driving the second DC-SQUID.

The superconducting output amplifier may further include a second superconducting OA stage comprising a third DC-SQUID and a fourth DC-SQUID arranged in parallel to the third DC-SQUID. The superconducting output amplifier may further include (1) a second splitter configured to split a second set of SFQ pulses corresponding to the SFQ pulse train into a third RZ signal and a fourth RZ signal, (2) a third RZ-NRZ converter configured to convert the third RZ signal into a third NRZ signal for driving the third DC-SQUID, and (3) a fourth RZ-NRZ converter configured to convert the fourth RZ signal into a fourth NRZ signal for driving the fourth DC-SQUID.

The superconducting output amplifier may further include an external direct current (DC) source configured to pre-bias each of the first DC-SQUID, the second DC-SQUID, the third DC-SQUID, and the fourth DC-SQUID. The second superconducting OA stage may be arranged in series with the first superconducting OA stage.

The SFQ pulse train may comprise positive SFQ pulses and negative SFQ pulses, and each of the first DC-SQUID, the second DC-SQUID, the third DC-SQUID, and the fourth DC-SQUID may be powered using alternating current (AC) clock signals. The SFQ pulse train may comprise data corresponding to reciprocal quantum logic return to zero encoding or data corresponding to phase-mode logic encoding.

In another aspect, the present disclosure relates to a method for a superconducting output amplifier comprising a plurality of superconducting output amplifier (OA) stages. The method may include receiving a pulse train comprising a plurality of single flux quantum (SFQ) pulses. The method may further include processing the pulse train to generate a first set of return to zero (RZ) signals and a second set of RZ signals. The method may further include using a first set of return to zero to non-return to zero (RZ-NRZ) converters, converting the first set of RZ signals into a first set of non-return to zero (NRZ) signals for driving a first set of direct current-superconducting quantum interference devices (DC-SQUIDS) associated with the plurality of superconducting OA stages. The method may further include using a second set of RZ-NRZ converters, converting the second set of RZ signals into a second set of NRZ signals for driving a second set of DC-SQUIDS associated with the plurality of superconducting OA stages. The method may further include using the stack of the plurality of superconducting OA stages, converting the first set of NRZ signals and the second set of NRZ signals into an output voltage waveform.

The processing the pulse train to generate a first set of RZ signals and the second set of RZ signals may comprise using a splitter, splitting the plurality of SFQ pulses corresponding to the SFQ pulse train into the first set of RZ signals and the second set of RZ signals. The pulse train may comprise data corresponding to reciprocal quantum logic return to zero encoding. The pulse train may comprise data corresponding to phase-mode logic encoding.

The plurality of SFQ pulses may comprise positive SFQ pulses and negative SFQ pulses. The method may further include providing power to each of the first set of DC-SQUIDS and the second set of DC-SQUIDS using alternating current (AC) clock signals. The method may further include, using an external direct current (DC) source pre-biasing each of the first set of DC-SQUIDs and the second set of DC-SQUIDs.

In yet another aspect, the present disclosure relates to a superconducting output amplifier including a first superconducting output amplifier (OA) stage having a first direct current-superconducting quantum interference device (DC-SQUID) and a second DC-SQUID arranged in parallel to the first DC-SQUID. The superconducting output amplifier may further include an input terminal for receiving a single flux quantum (SFQ) pulse train comprising a plurality of SFQ pulses, where the SFQ pulse train comprises data corresponding to reciprocal quantum logic return to zero encoding or data corresponding to phase-mode logic encoding. The superconducting output amplifier may further include a first splitter configured to split a first set of SFQ pulses corresponding to the SFQ pulse train into a first return to zero (RZ) signal and a second RZ signal. The superconducting output amplifier may further include a first return to zero to non-return to zero (RZ-NRZ) converter configured to convert the first RZ signal into a first non-return to zero (NRZ) signal for driving the first DC-SQUID, and a second RZ-NRZ converter configured to convert the second RZ signal into a second NRZ signal for driving the second DC-SQUID.

The superconducting output amplifier may further include a second superconducting OA stage comprising a third DC-SQUID and a fourth DC-SQUID arranged in parallel to the third DC-SQUID. The superconducting output amplifier may further include: (1) a second splitter configured to split a second set of SFQ pulses corresponding to the SFQ pulse train into a third RZ signal and a fourth RZ signal, (2) a third RZ-NRZ converter configured to convert the third RZ signal into a third NRZ signal for driving the third DC-SQUID, and (3) a fourth RZ-NRZ converter configured to convert the fourth RZ signal into a fourth NRZ signal for driving the fourth DC-SQUID.

The superconducting output amplifier may further include an external direct current (DC) source configured to pre-bias each of the first DC-SQUID, the second DC-SQUID, the third DC-SQUID, and the fourth DC-SQUID. The second superconducting OA stage may be arranged in series with the first superconducting OA stage. The SFQ pulse train may comprise positive SFQ pulses and negative SFQ pulses, and each of the first DC-SQUID, the second DC-SQUID, the third DC-SQUID, and the fourth DC-SQUID may be powered using alternating current (AC) clock signals.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid-state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with, transmission media, Transmission media is used for transferring data and/or instruction to or from a machine. Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated othemise, terms such as "first" and "second" are used to arbitrarily distinguish between the elements such terms describe. Thus, these terms are not necessarily intended to indicate temporal or other prioritization of such elements.

What is claimed:

1. A superconducting output amplifier comprising:
   a first superconducting output amplifier (OA) stage having a first direct current-superconducting quantum interference device (DC-SQUID) and a second DC-SQUID arranged in parallel to the first DC-SQUID, wherein the first DC-SQUID and the second DC-SQUID are coupled via an inductor forming a compound DC-SQUID;
   an input terminal of the first superconducting OA stage for receiving a single flux quantum (SFQ) pulse train;
   a positive output voltage terminal of the compound DC-SQUID for outputting a positive output voltage in response to the SFQ pulse train;
   a negative output voltage terminal of the compound DC-SQUID for outputting a negative output voltage in response to the same SFQ pulse train;
   a first splitter configured to split a first set of SFQ pulses corresponding to the SFQ pulse train into a first return to zero (RZ) signal and a second RZ signal; and
   a first return to zero to non-return to zero (RZ-NRZ) converter configured to convert the first RZ signal into a first non-return to zero (NRZ) signal for driving the first DC-SQUID, and a second RZ-NRZ converter configured to convert the second RZ signal into a second NRZ signal for driving the second DC-SQUID, wherein the first DC-SQUID and the second DC-SQUID associated with the compound DC-SQUID are configured to be active at the same time when, respectively, generating the positive output voltage at the positive output voltage terminal of the compound DC-SQUID and the negative output voltage at the negative output voltage terminal of the compound DC-SQUID in response to currents generated by the first RZ signal and the second RZ signal based on the same SFQ pulse train received via the input terminal of the first superconducting OA stage.

2. The superconducting output amplifier of claim 1, further comprising a second superconducting OA stage comprising a third DC-SQUID and a fourth DC-SQUID arranged in parallel to the third DC-SQUID.

3. The superconducting output amplifier of claim 2, further comprising: (1) a second splitter configured to split a second set of SFQ pulses corresponding to the SFQ pulse train into a third RZ signal and a fourth RZ signal, (2) a third RZ-NRZ converter configured to convert the third RZ signal into a third NRZ signal for driving the third DC-SQUID, and (3) a fourth RZ-NRZ converter configured to convert the fourth RZ signal into a fourth NRZ signal for driving the fourth DC-SQUID.

4. The superconducting output amplifier of claim 3, further comprising an external direct current (DC) source configured to pre-bias each of the first DC-SQUID, the second DC-SQUID, the third DC-SQUID, and the fourth DC-SQUID.

5. The superconducting output amplifier of claim 2, wherein the second superconducting OA stage is arranged in series with the first superconducting OA stage.

6. The superconducting output amplifier of claim 2, wherein the SFQ pulse train comprises positive SFQ pulses and negative SFQ pulses, and wherein each of the first DC-SQUID, the second DC-SQUID, the third DC-SQUID, and the fourth DC-SQUID is powered using alternating current (AC) clock signals.

7. The superconducting output amplifier of claim 6, wherein the SFQ pulse train comprises data corresponding to reciprocal quantum logic return to zero encoding or data corresponding to phase-mode logic encoding.

8. A method for a superconducting output amplifier comprising a plurality of superconducting output amplifier (OA) stages, wherein the superconducting output amplifier comprises an input terminal, a positive output voltage terminal, and a negative output voltage terminal, the method comprising:

receiving via the input terminal a pulse train comprising a plurality of single flux quantum (SFQ) pulses;

processing the pulse train to generate a first set of return to zero (RZ) signals and a second set of RZ signals;

using a first set of return to zero to non-return to zero (RZ-NRZ) converters, converting the first set of RZ signals into a first set of non-return to zero (NRZ) signals for driving a first set of direct current-superconducting quantum interference devices (DC-SQUIDS) associated with the plurality of superconducting OA stages, wherein each of the first set of DC-SQUIDS is associated with a first compound DC-SQUID;

using a second set of RZ-NRZ converters, converting the second set of RZ signals into a second set of NRZ signals for driving a second set of DC-SQUIDs associated with the plurality of superconducting OA stages, wherein each of the second set of DC-SQUIDS is associated with a second compound DC-SQUID, and wherein the first set of DC-SQUIDS associated with the first compound DC-SQUID and the second set of DC-SQUIDs associated with the second compound DC-SQUID are configured to be active at the same time when, respectively, providing a positive output voltage at the positive output voltage terminal of the superconducting output amplifier and providing a negative output voltage at the negative output voltage terminal of the superconducting output amplifier; and using the stack of the plurality of superconducting OA stages, converting the first set of NRZ signals and the second set of NRZ signals into an output voltage waveform representative of a differential between the positive output voltage at the positive output voltage terminal and the negative output voltage at the negative output voltage terminal.

9. The method of claim 8, wherein processing the pulse train to generate a first set of RZ signals and the second set of RZ signals comprises using a splitter, splitting the plurality of SFQ pulses corresponding to the SFQ pulse train into the first set of RZ signals and the second set of RZ signals.

10. The method of claim 8, wherein the pulse train comprises data corresponding to reciprocal quantum logic return to zero encoding.

11. The method of claim 8, wherein the pulse train comprises data corresponding to phase-mode logic encoding.

12. The method of claim 8, wherein the plurality of SFQ pulses comprise positive SFQ pulses and negative SFQ pulses.

13. The method of claim 8, further comprising providing power to each of the first set of DC-SQUIDS and the second set of DC-SQUIDS using alternating current (AC) clock signals.

14. The method of claim 8, further comprising, using an external direct current (DC) source pre-biasing each of the first set of DC-SQUIDS and the second set of DC-SQUIDS.

15. A superconducting output amplifier comprising:

a first superconducting output amplifier (OA) stage having a first direct current-superconducting quantum interference device (DC-SQUID) and a second DC-SQUID arranged in parallel to the first DC-SQUID, wherein the first DC-SQUID and the second DC-SQUID are coupled via an inductor forming a compound DC-SQUID;

an input terminal of the first superconducting OA stage for receiving a single flux quantum (SFQ) pulse train comprising a plurality of SFQ pulses, wherein the SFQ pulse train comprises data corresponding to reciprocal quantum logic return to zero encoding or data corresponding to phase-mode logic encoding;

a positive output voltage terminal of the compound DC-SQUID for outputting a positive output voltage in response to the SFQ pulse train;

a negative output voltage terminal of the compound DC-SQUID for outputting a negative output voltage in response to the same SFQ pulse train;

a first splitter configured to split a first set of SFQ pulses corresponding to the SFQ pulse train into a first return to zero (RZ) signal and a second RZ signal; and a first return to zero to non-return to zero (RZ-NRZ) converter configured to convert the first RZ signal into a first non-return to zero (NRZ) signal for driving the first DC-SQUID, and a second RZ-NRZ converter configured to convert the second RZ signal into a second NRZ signal for driving the second DC-SQUID, wherein the first DC-SQUID and the second DC-SQUID associated with the compound DC-SQUID are configured to be active at the same time when, respectively, generating the positive output voltage terminal at the positive output voltage terminal of the compound DC-SQUID and the negative output voltage at the negative output voltage terminal of the compound DC-SQUID in response to currents generated by the first RZ signal and the second RZ signal based on the same SFQ pulse train received via the input terminal of the first superconducting QA stage.

16. The superconducting output amplifier of claim 15, further comprising a second superconducting OA stage comprising a third DC-SQUID and a fourth DC-SQUID arranged in parallel to the third DC-SQUID.

17. The superconducting output amplifier of claim 16, further comprising: (1) a second splitter configured to split a second set of SFQ pulses corresponding to the SFQ pulse train into a third RZ signal and a fourth RZ signal, (2) a third RZ-NRZ converter configured to convert the third RZ signal into a third NRZ signal for driving the third DC-SQUID, and (3) a fourth RZ-NRZ converter configured to convert the fourth RZ signal into a fourth NRZ signal for driving the fourth DC-SQUID.

18. The superconducting output amplifier of claim 17, further comprising an external direct current (DC) source configured to pre-bias each of the first DC-SQUID, the second DC-SQUID, the third DC-SQUID, and the fourth DC-SQUID.

19. The superconducting output amplifier of claim 16, wherein the second superconducting OA stage is arranged in series with the first superconducting OA stage.

20. The superconducting output amplifier of claim 16, wherein the SFQ pulse train comprises positive SFQ pulses and negative SFQ pulses, and wherein each of the first DC-SQUID, the second DC-SQUID, the third DC-SQUID, and the fourth DC-SQUID is powered using alternating current (AC) clock signals.

* * * * *